US010829677B2

United States Patent
Bland et al.

(10) Patent No.: US 10,829,677 B2
(45) Date of Patent: Nov. 10, 2020

(54) GRAPHENE DOPED ALUMINUM COMPOSITE AND METHOD OF FORMING

(71) Applicant: GE Aviation Systems Limited, Gloucestershire (GB)

(72) Inventors: Aaron Bland, Tewkesbury (GB); Alexander James Rainbow, Swindon (GB); David Hall Sidgwick, Wales (GB); Michael James Smith, Chipping Norton (GB)

(73) Assignee: GE Aviation Systems Limited, Cheltenham (GB)

( * ) Notice: Subject to any disclaimer, the term of this patent is extended or adjusted under 35 U.S.C. 154(b) by 0 days.

(21) Appl. No.: 15/970,399

(22) Filed: May 3, 2018

(65) Prior Publication Data
US 2018/0372430 A1 Dec. 27, 2018

Related U.S. Application Data

(60) Provisional application No. 62/525,504, filed on Jun. 27, 2017.

(51) Int. Cl.
*C09K 5/14* (2006.01)
*C01B 32/194* (2017.01)
(Continued)

(52) U.S. Cl.
CPC .............. *C09K 5/14* (2013.01); *C01B 32/194* (2017.08); *C22C 1/0416* (2013.01); *C22C 1/10* (2013.01); *C22C 1/1026* (2013.01); *F28F 21/02* (2013.01); *F28F 21/084* (2013.01); *H01B 1/023* (2013.01); *B22F 2998/10* (2013.01); *B64D 47/00* (2013.01);
(Continued)

(58) Field of Classification Search
CPC ... C01B 32/182; C01B 32/194; C01B 32/198; C22C 1/0416; C22C 1/10; C22C 1/1026; C22C 21/00; F28F 21/02; F28F 21/084; C09K 5/14; H01B 1/02; H01B 1/023; H01B 1/04; B22F 2998/10
See application file for complete search history.

(56) References Cited

U.S. PATENT DOCUMENTS

| 8,263,843 B2 | 9/2012 | Kim |
| 8,476,739 B2 | 7/2013 | Okai |

(Continued)

FOREIGN PATENT DOCUMENTS

| CN | 102127721 A | 7/2011 |
| CN | 104651680 A | 5/2015 |

(Continued)

OTHER PUBLICATIONS

English machine translation of Dai et al. CN 105063401 A. (Year: 2015).*

(Continued)

*Primary Examiner* — Matthew R Diaz
(74) *Attorney, Agent, or Firm* — McGarry Bair PC (57) ABSTRACT

Aspects of the disclosure generally relate to a graphene doped aluminum composite, as well as a method of forming such a composite. Devices for heat dissipation can include such a graphene doped aluminum composite, where the composite can be formed in a process that includes crystallizing aluminum around substantially uniformly dispersed graphene.

9 Claims, 7 Drawing Sheets (51) Int. Cl.
*C22C 1/10* (2006.01)
*F28F 21/02* (2006.01)
*F28F 21/08* (2006.01)
*C22C 1/04* (2006.01)
*H01B 1/02* (2006.01)
*B64D 47/00* (2006.01)
*F28D 21/00* (2006.01)
*H05K 7/20* (2006.01)
*F28D 7/16* (2006.01)
*B64D 13/06* (2006.01)

(52) U.S. Cl.
CPC .... *B64D 2013/0614* (2013.01); *F28D 7/1615* (2013.01); *F28D 2021/0021* (2013.01); *H05K 7/20545* (2013.01)

(56) References Cited

U.S. PATENT DOCUMENTS

| | | | |
|---|---|---|---|
| 8,481,850 | B2 | 7/2013 | Curtin |
| 8,833,431 | B2 | 9/2014 | Xiao et al. |
| 9,095,941 | B2 * | 8/2015 | Kim .................. B82Y 10/00 |
| 9,567,223 | B2 | 2/2017 | Song |
| 2013/0216425 | A1 | 8/2013 | Xiao et al. |
| 2014/0197353 | A1 | 7/2014 | Hong |
| 2015/0315449 | A1 * | 11/2015 | Kim .................. C09K 5/14 165/185 |
| 2017/0225233 | A1 | 8/2017 | Zhamu |

FOREIGN PATENT DOCUMENTS

| | | | |
|---|---|---|---|
| CN | 105039795 | A | 11/2015 |
| CN | 105063401 | A * | 11/2015 |
| CN | 105063401 | A | 11/2015 |
| CN | 105349846 | A | 2/2016 |
| CN | 105385870 | A | 3/2016 |
| CN | 105624446 | A * | 6/2016 |
| CN | 105821257 | A | 8/2016 |
| CN | 105861865 | A * | 8/2016 |
| CN | 105861865 | A | 8/2016 |
| CN | 106191537 | A | 12/2016 |
| CN | 106367648 | A | 2/2017 |
| CN | 106521217 | A | 3/2017 |
| CN | 106566963 | A * | 4/2017 |
| CN | 106567785 | A | 4/2017 |
| CN | 107299239 | A | 10/2017 |
| WO | 10008399 | A1 | 1/2010 |
| WO | 2010008399 | A1 | 1/2010 |
| WO | 18064137 | A1 | 4/2018 |

OTHER PUBLICATIONS

English machine translation of Liu et al. CN 105624446 A. (Year: 2016).*
English machine translation of Hong et al. CN 105861865 A. (Year: 2016).*
English machine translation of Dai et al. CN 106566963 A. (Year: 2017).*
Chinese Patent Office; First Office Action in Chinese Patent Application No. 201810678919.4; dated Sep. 3, 2019; 8 pages; China.
Intellectual Property Office; Combined Search and Examination Report in Patent Application No. GB1810382.0; dated Nov. 2, 2018; 7 pages; United Kingdom.
Jingyue Wang et al., Reinforcement with Graphene Nanosheets in Aluminum Matrix Composites, 6 pages, 2012, Faculty of Engineering and Information Sciences, University of Wollongong, Australia.
Muhammad Rashad et al., Investigation on microstructural, mechanical and electrochemical properties of aluminum composites reinforced with graphene nanoplatelets, 11 pages, Mar. 4, 2015, Available online at www.sciencedirect.com, China.
Pulkit Garg et al., Structural and Mechanical Properties of Graphene reinforced Aluminum Matrix Composites, 13 pages, Nov. 26, 2015, India.
Intellectual Property Office, Examination Report under Section 18(3) re Application No. GB1810382.0, dated Oct. 7, 2019, 9 pages, South Wales, NP.

* cited by examiner

GRAPHENE DOPED ALUMINUM COMPOSITE AND METHOD OF FORMING

CROSS REFERENCE TO RELATED APPLICATIONS

This application claims the benefit of U.S. Provisional Application Ser. No. 62/525,504 filed Jun. 27, 2017, which is incorporated herein by reference in its entirety.

BACKGROUND

Contemporary power systems such as those utilized in aircrafts can use avionics in order to control the various equipment and operations for flying the aircraft. The avionics can include electronic components carried by a circuit board. The avionics or the circuit boards can be stored in an electronic chassis, for example an avionics chassis, which performs several beneficial functions including protecting the avionics from lightning strikes, dissipating the heat generated by the avionics or electronic components, and protecting the avionics from environmental exposure.

Avionics can produce high heat loads, and traditional devices for heat dissipation can introduce an appreciable amount of extra weight to the aircraft; the metal used in avionics systems wiring can further increase the aircraft weight. It can be beneficial to utilize conducting materials having high electrical and thermal conductivities to improve cooling, while also having low densities for weight reduction.

BRIEF DESCRIPTION

In one aspect of the present disclosure, a method of forming a graphene doped aluminum composite includes crystallizing aluminum around substantially uniformly dispersed graphene to form a graphene doped aluminum composite.

In another aspect of the present disclosure, a composite can include graphene rings each doped with at least one aluminum crystal.

In yet another aspect of the present disclosure, a thermal management member can include a graphene doped aluminum composite body including graphene rings each doped with at least one aluminum crystal to define particles of the composite.

DETAILED DESCRIPTION

Aspects of the present disclosure describe an approach to form and utilize a graphene doped aluminum composite material. Aircraft and avionics have increasing demands and higher power density in a smaller space has seen an increasing requirement of power generating devices. New power generation and conversion units can have requirements for new materials and more efficient electrical and thermal management. While aluminum alloys are a common lightweight material used in current heat exchanger design, the increasing requirements have resulted in aluminum and copper becoming a constraint. The utilization of graphene in a graphene doped aluminum composite contributes to the ability to design for increased power, and maintain or even decrease volume and weight, when compared to current materials. Graphene has a lower density, higher electrical conductivity, and higher thermal conductivity when compared to aluminum or copper, and these properties can be beneficial in avionics applications.

By decreasing the material density, the composite described herein lends itself to an increased power density while taking up the same or less volume and weight. An increased power density allows for increased computational power or increased sensor or emitter power supported within the physically-constrained space, weight-constrained space, or volume-constrained space.

While this composite material can have general applicability, the environment of an aircraft and specific application of an avionics chassis and electrical wiring will be described in further detail. Aspects of the graphene doped aluminum described herein can allow for increased heat dissipation and electrical conductivity with decreased volume and weight when compared to current aluminum or copper.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

Figure 1:
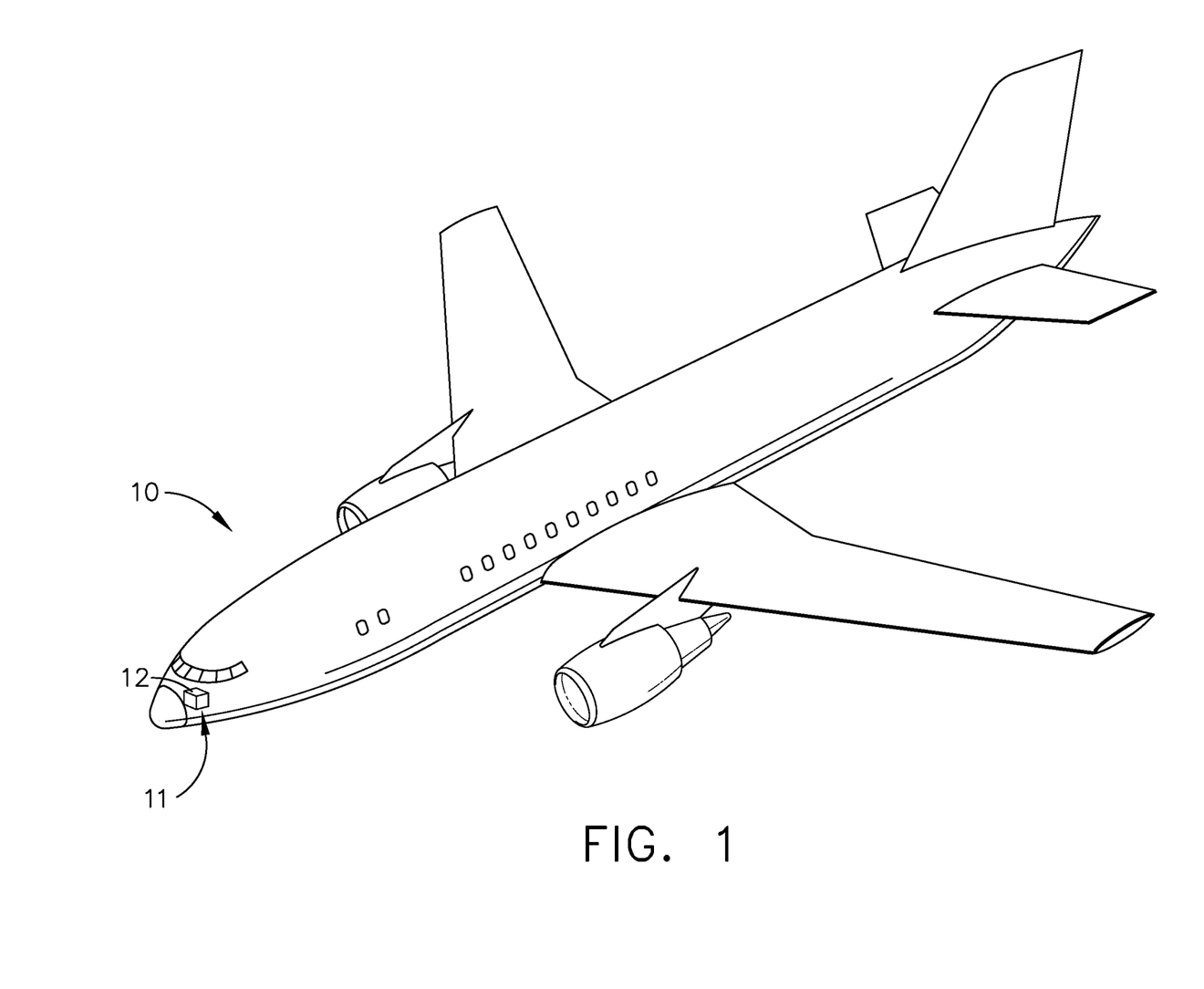
FIG. 1 is a perspective view of an aircraft having an electronics chassis in accordance with various aspects described herein.

FIG. 1 schematically illustrates an aircraft 10 with a thermal management member 11, illustrated as an on-board electronics chassis 12 (shown in phantom) for housing avionics or avionics components for use in the operation of the aircraft 10. It will be understood that the thermal management member 11 can also include heat spreaders, heat sinks, heat exchanger, radiators, or heat pipes in non-limiting examples. The electronics chassis 12 can house a variety of avionics elements and protects them against contaminants, electromagnetic interference (EMI), radio frequency interference (RFI), vibrations, and the like. Alternatively or additionally, the electronics chassis 12 can have a variety of avionics mounted thereon. It will be understood that the electronics chassis 12 can be located anywhere within the aircraft 10, not just the nose as illustrated.

While illustrated in a commercial airliner, the electronics chassis 12 can be used in any type of aircraft, for example, without limitation, fixed-wing, rotating-wing, rocket, commercial aircraft, personal aircraft, and military aircraft. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
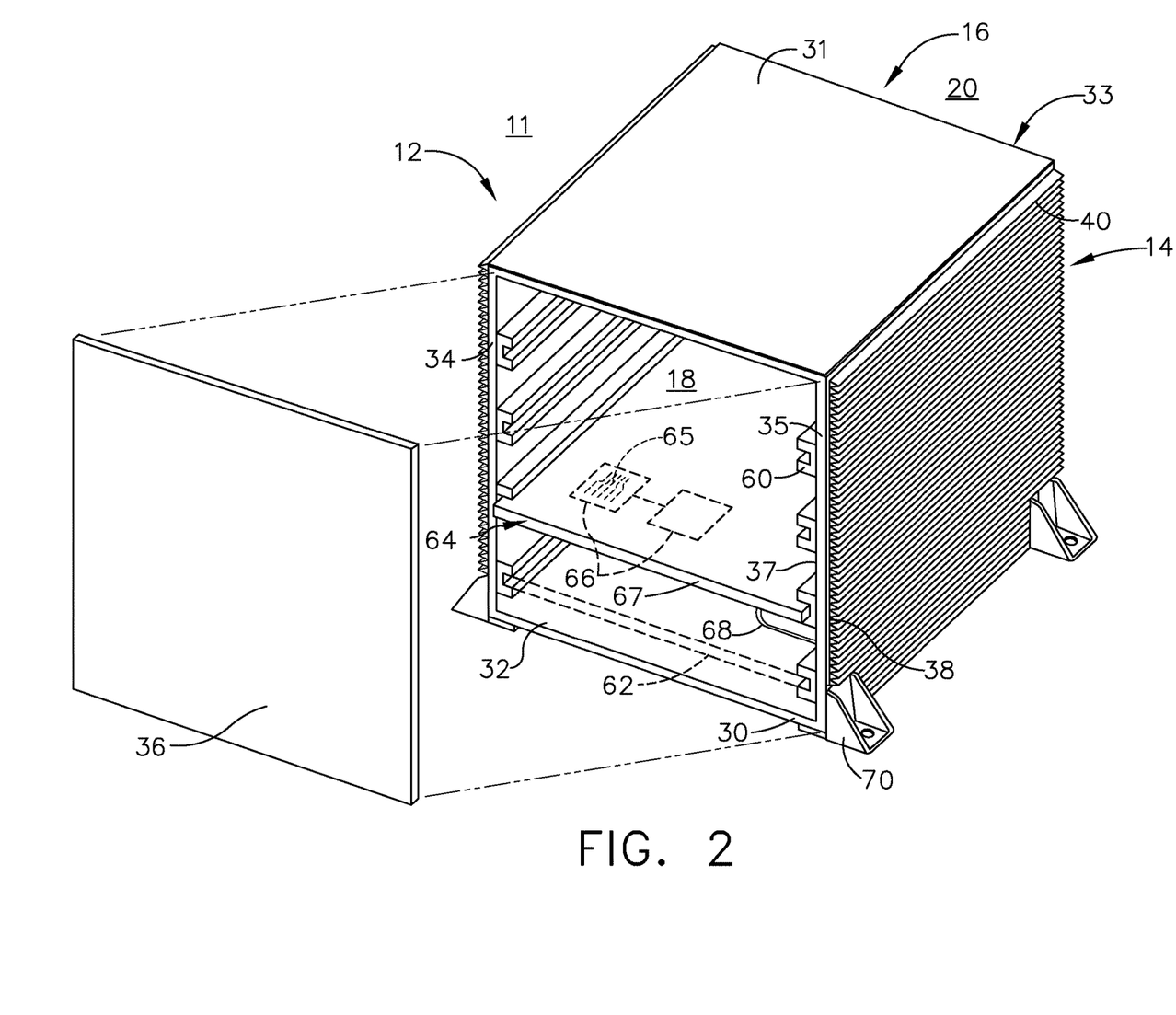
FIG. 2 is an exemplary electronics chassis of FIG. 1 including a graphene doped aluminum composite in accordance with various aspects described herein.
Figure 4:
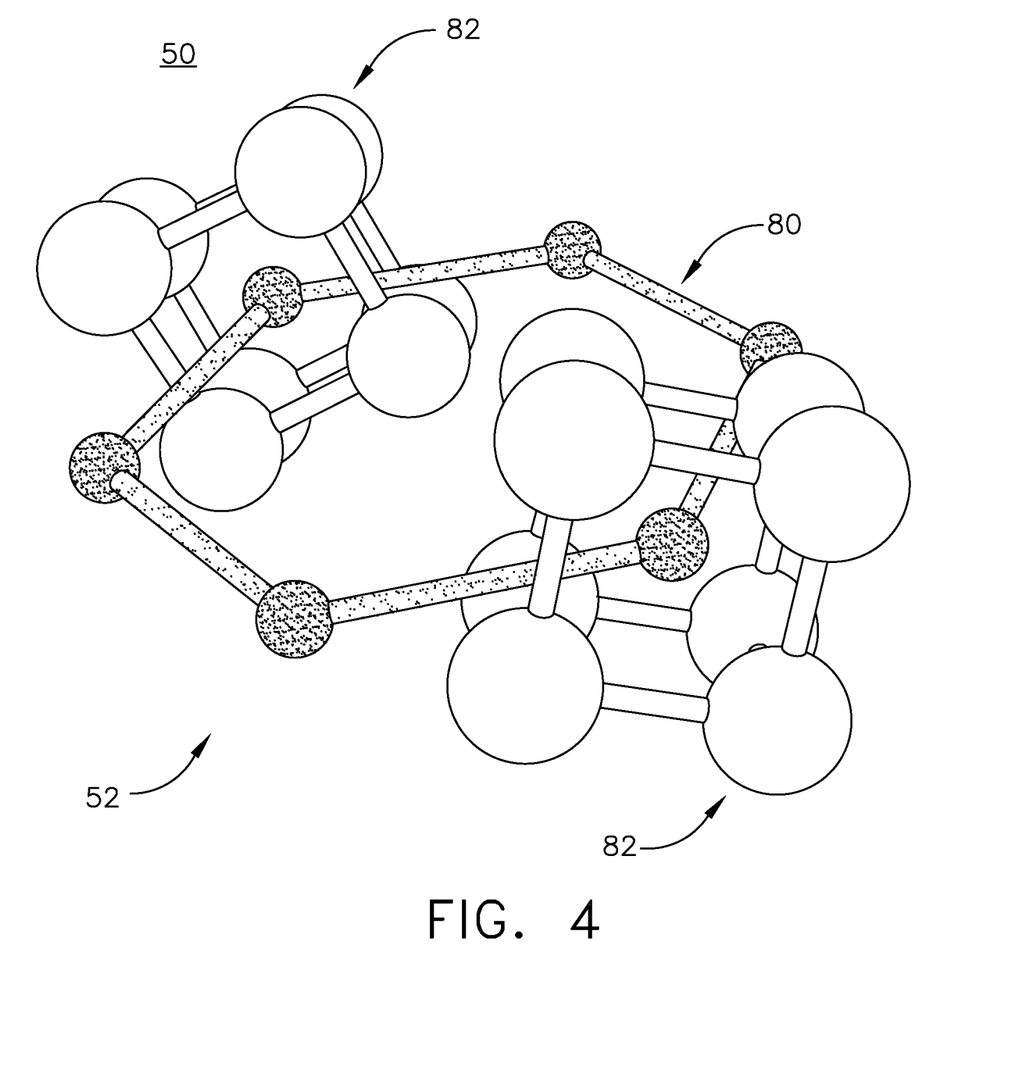
FIG. 4 illustrates a molecular structure of the graphene doped aluminum composite of FIG. 2.

FIG. 2 illustrates the electronics chassis 12 in further detail, where the electronics chassis 12 can include a heat exchanger 14 having a chassis housing 16 defining an interior 18 and exterior 20. The electronics chassis 12 can include a chassis frame 30 having a top cover 31, a bottom wall 32, a back wall 33, and opposing sidewalls 34, 35. The chassis frame 30 can further include a removable front cover 36, providing access to the interior 18 of the electronics chassis 12 when removed, and at least partially restricting access to the interior 18 when coupled or mounted to the chassis frame 30. In addition, the sidewalls 34, 35 can include an interior surface 37 and an exterior surface 38. It is contemplated that the electronics chassis 12 and any components thereof can be formed from any suitable material including, but not limited to, a graphene doped aluminum composite material 50 (FIG. 4). For example, the heat exchanger 14 can be formed from the graphene doped aluminum composite 50.

Further still, a set of fins 40 can project from the exterior surface 38 of the sidewalls 34, 35. The set of fins 40 can also be formed of any suitable material including, but not limited to, a graphene doped aluminum composite 50. While the set of fins 40 are shown on the sidewalls 34, 35, the set of fins 40 can be disposed on any exterior portion of the electronics chassis 12, such as the top cover 31 or the bottom wall 32 in additional non-limiting examples. While the set of fins 40 are shown extending fully along the sidewalls 34, 35, it should be appreciated that the set of fins 40 need not extend the full length of the sidewalls 34, 35, and can be organized in other configurations.

The electronics chassis 12 can further include a set of card rails 60 within the interior 18 and supported by the interior surface 37 of the sidewalls 34, 35. The set of card rails 60 can be horizontally aligned on the interior surfaces 37 and spaced on opposing sidewalls 34, 35 to define effective card slots 62 (illustrated by the phantom lines) for receiving at least a portion of an avionics system card 64. Each avionics card 64 can include a set of wires 65. The set of wires can be formed of any suitable material including, but not limited to, the graphene doped aluminum composite 50 (FIG. 4). At least one heat producing component 66 can be included on the avionics system card 64. It should be understood that the set of wires 65 can be used within the heat producing component 66, or to connect multiple heat producing components 66, or anywhere else within or on the avionics system card 64 as desired. In addition, while only one avionics system card 64 is shown, the electronics chassis 12 can be configured to house, support, or include any number of avionics system cards 64.

Each avionics system card 64 can include a heat spreader 67 which can be made from a conductive material including, but not limiting to, the graphene doped aluminum composite 50. The heat spreader 67 can direct heat to move from the heat producing component 66 to the sidewalls 34, 35 and away from the electronics chassis 12 through the set of fins 40. In addition, a heat pipe 68 can be coupled to the avionics system card 64 and a portion of the frame 30, such as the sidewall 35, to direct heat away from the heat producing component 66. Such a heat pipe 68 can also be made from the graphene doped aluminum composite 50. Optionally, the heat pipe 68 and the heat spreader 67 can be utilized in combination for a single avionics system card 64. In still another example, a first avionics system card can utilize a heat pipe while a second avionics system card can utilize a heat spreader.

By way of non-limiting example, it is contemplated that air can be provided along the set of fins 40 to move the heat away. It is further contemplated that heat introduced to the exterior 20 of the electronics chassis 12 will dissipate by convection as well.

A set of mounting feet 70 can extend from the chassis housing 16 to facilitate mounting the electronics chassis 12 to the aircraft 10 by means of bolts or other conventional fasteners. Further, the set of mounting feet 70 can function as an electrical ground to ground the electronics chassis 12 to the frame of the aircraft 10. While the set of mounting feet 70 are shown in this example, the electronics chassis 12 can be used with many types of attachment mechanism.

Figure 3:
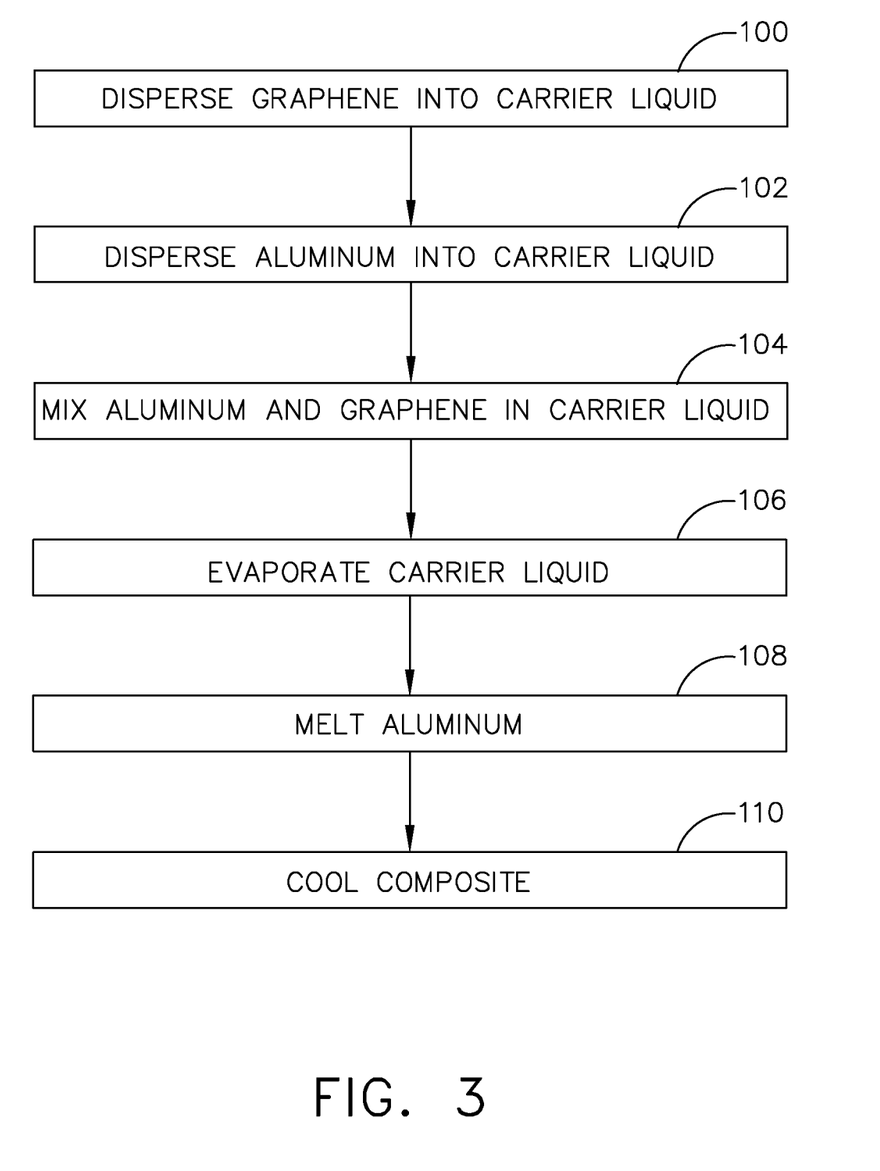
FIG. 3 illustrates a method for forming the graphene doped aluminum composite of FIG. 2.

FIG. 3 illustrates a method of forming a graphene doped aluminum composite 50 such as that utilized in the electronics chassis 12 and avionics system card 64. At 100, graphene powder can be substantially homogeneously or uniformly dispersed into a carrier liquid to form a first solution. While the term "graphene powder" has been utilized throughout this document, it will be understood that the graphene powder can also include a graphene oxide powder.

As used herein, a substance being "substantially uniformly dispersed" or "substantially homogeneously dispersed" can refer to particles of that substance being distributed evenly throughout a second substance, such as a powder being distributed evenly throughout a carrier, or a first powder and a second powder being combined to form a powder mixture. In one example, "substantially uniformly dispersed" or "substantially homogeneously dispersed" can refer to a spacing distance between pairs of particles of a substance not varying by more than a predetermined value, such as 5%, smaller than 10%, or smaller than 20%, in non-limiting examples. In another example, "substantially uniformly dispersed" or "substantially homogeneously dispersed" can refer to a size of clumped or coagulated particles (e.g. an agglomerate or an aggregate) of a substance being smaller than a predetermined size, such as 1 nm or 1 µm in non-limiting examples. It will also be understood that "substantially homogeneously dispersing" or "substantially uniformly dispersing" can refer to the act of forming a substantially homogeneous or uniform dispersion, respectively.

It is further contemplated that the carrier can be in any desired form such as liquid or solid, and will be described herein as an exemplary carrier liquid within which an exemplary powder (such as graphene powder) can be dispersed. The carrier liquid can be any suitable carrier liquid including but not limited to, acetone, methyl ethyl ketone (MEK), or any suitable organic liquid.

At 102, aluminum powder can be substantially homogeneously dispersed into the first solution with the graphene powder. It is contemplated that the graphene and aluminum powders can be added to the carrier liquid in any order, or simultaneously, to form the solution. Further still, the graphene and aluminum powders can be added to separate carrier liquids and then combined.

At 104, the aluminum and graphene powders can be mixed in the carrier liquid until forming a substantially homogeneous dispersion of both aluminum and graphene throughout the carrier liquid. In non-limiting examples the mixing can be accomplished by stirring, either continuously or in intervals, or by use of an ultrasonic device which can decrease the mixing time. At 106, the carrier liquid can be removed by evaporation or other suitable measures, leaving behind a powder mixture of substantially uniformly dispersed aluminum and substantially uniformly dispersed graphene. The evaporating process can be performed at a suitable temperature based on characteristics of the carrier liquid. In a non-limiting example where acetone is utilized as the carrier liquid, evaporation can occur at room temperature (20° C.). In another non-limiting example, a vacuum chamber can be used with or without an auxiliary heating device to evaporate the carrier liquid.

At 108, the powder mixture can be placed in a suitable container and heated in a furnace to a temperature of at least 660° C., where the aluminum can melt while the graphene remains in solid form within the container. During this process the furnace can be filled with a protective atmosphere utilizing a gas such as argon or nitrogen to prevent oxidation of the mixture. At 110, the substantially uniformly dispersed graphene can form a suitable seed medium to assist in crystallizing the aluminum when cooled to room temperature, and the resulting graphene doped aluminum composite 50 can be available for further processing such as pressing or extrusion, or for immediate use.

The structure of the graphene doped aluminum composite 50 can be seen in further detail in FIG. 4. A planar hexagonal graphene ring structure 80 includes a six-way bond between carbon atoms. The graphene ring structure 80 can seed the formation of two cubic close-packed crystals 82 of aluminum on each structure 80 to form a particle 52 of the composite 50 as shown. It can also be seen that the graphene ring structure 80 intersects each of the crystals 82 in the particle 52.

Graphene typically refers to a hexagonal lattice of ring structures 80 forming a nearly two-dimensional sheet with at least five times higher electrical and thermal conductivities than traditional materials such as aluminum or copper. When utilizing graphene ring structures 80 to seed the aluminum crystals 82, the resulting composite 50 can have an electrical conductivity of at least 0.7 µS/m and a thermal conductivity of at least 400 W/m·K. In another example, the resulting composite 50 can have an electrical conductivity ranging from 0.5-2.0 µS/m and a thermal conductivity ranging from 300-700 W/m·K. It can be appreciated that either or both conductivities of the composite 50 approach or exceed the electrical or thermal conductivities of copper, and are increased by approximately 200% compared to the electrical or thermal conductivities of aluminum.

Figure 5:
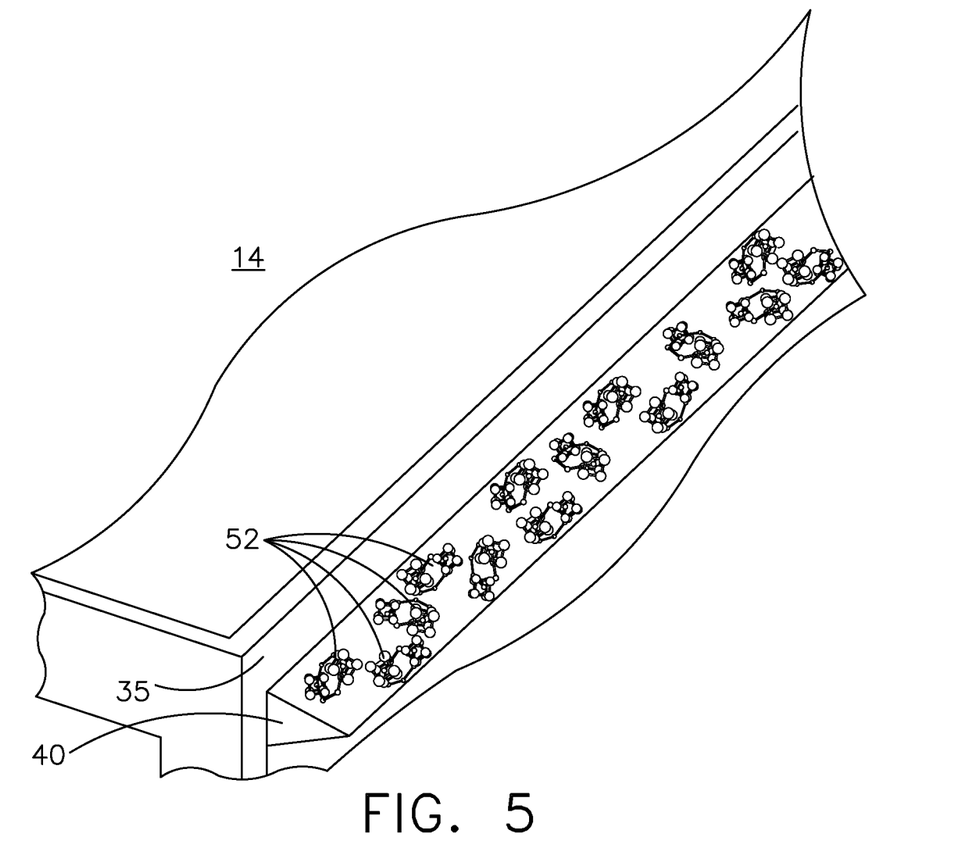
FIG. 5 illustrates a portion of the electronics chassis of FIG. 2 including the molecular structure of FIG. 4.

A portion of the heat exchanger 14 is illustrated in FIG. 5 and schematically illustrate that set of fins 40 can be made from the graphene doped aluminum composite 50. Further still, it is schematically illustrated that the particles 52 of the composite 50 can be arranged in a variety of orientations, including random orientations, within the body of each fin 40 as shown. In non-limiting examples, a first particle can be oriented perpendicularly to a second particle, or two particles can be oriented parallel to one another. In still another example multiple particles can have random orientations within the composite 50.

Figure 6:
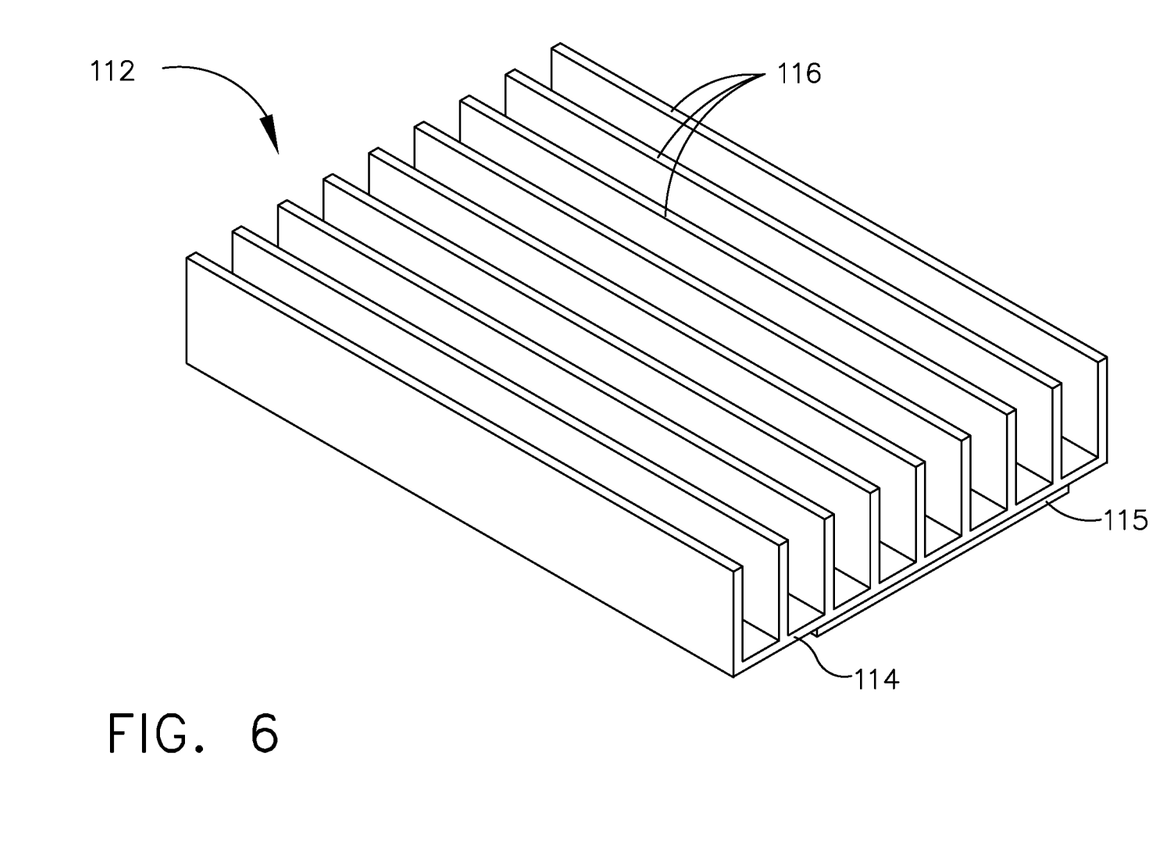
FIG. 6 is a perspective view of a conductive component in the form of a heat sink including the graphene doped aluminum composite of FIG. 2.

Turning to FIG. 6, it is contemplated that the graphene doped aluminum composite 50 can be utilized in a wide variety of conductive components. An exemplary heat sink 112 is illustrated which can be utilized to cool a heat-producing component 115, including electrical heat-producing components. The heat sink 112 includes a base portion 114 configured to couple to the heat-producing component 115. The heat sink 112 also includes a plurality of fins 116 extending from the base portion 114 to conduct heat away from the heat-producing component and to radiate heat to the surrounding atmosphere. The fins are illustrated as extending perpendicularly away from the base portion and can have any geometry, including flared, beveled, or cylindrical (such as pins), in non-limiting examples. The heat sink 112, or any portion thereof, can be made from the graphene doped aluminum composite 50.

Figure 7:
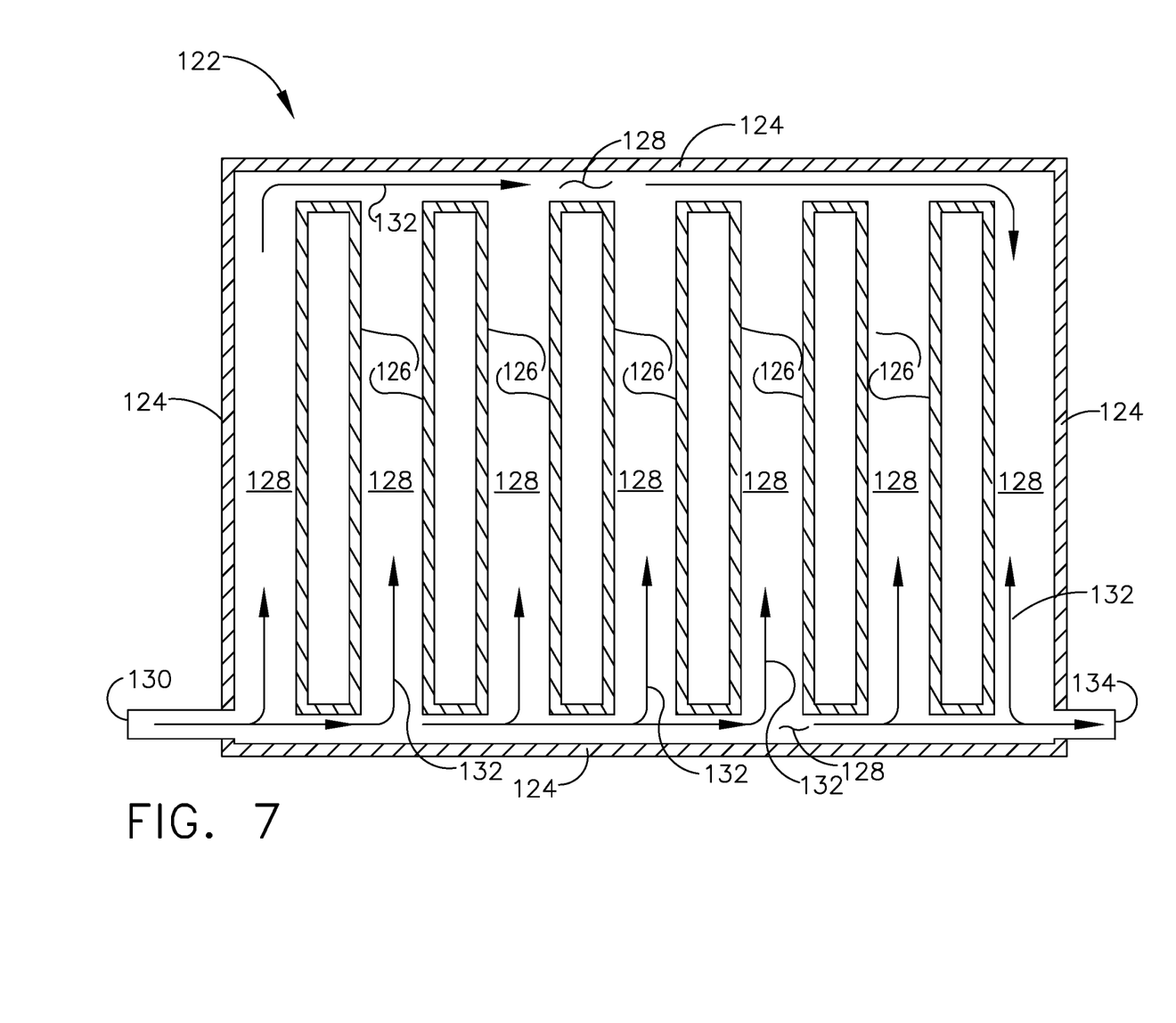
FIG. 7 is a sectional view of another conductive component in the form of a radiator including the graphene doped aluminum composite of FIG. 2.

FIG. 7 illustrates another conductive component in the form of a radiator 122. The radiator 122 includes conductive sidewalls 124 and a plurality of conductive partitions 126 defining an internal fluid pathway 128. An inlet 130 can supply heated fluid 132 to flow through the internal fluid pathway 128, and the fluid 132 can cool by transferring heat through the conductive sidewalls 124 or partitions 126 to the surrounding atmosphere. The cooled fluid 132 can exit the radiator 122 through an outlet 134. The radiator 122, or any portion thereof such as the sidewalls 124 or partitions 126, can be made from the graphene doped aluminum composite 50.

Aspects of the present disclosure provide for a variety of benefits. Wires utilizing the graphene doped aluminum composite can provide a viable alternative to copper wiring, as the composite can have similar or better electrical and thermal conductivities compared to those of copper but with less mass. It can be appreciated that improved electrical conductivity can provide for reduced heat production from electrical devices. In addition, the improved thermal conductivity can provide for more efficient cooling by heat exchangers, fins, heat spreaders, heat pipes, radiators, or the like. It can be further appreciated that electrical wires, devices, or other items utilizing the graphene doped aluminum composite on the aircraft can be reduced in weight compared to the traditional materials used in their construction, which can improve fuel efficiency or allow for additional items to be included onboard given the aircraft's weight restrictions.

Many other possible configurations in addition to those shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a graphene doped aluminum composite, the method comprising:
   homogenously dispersing graphene powder into a carrier liquid to form a first dispersion including homogenously dispersed graphene;
   homogenously dispersing aluminum powder into the first dispersion to form a homogeneous dispersion;
   evaporating the homogenous dispersion to form a powder mixture; and
   heating the powder mixture and cooling to form the graphene doped aluminum composite, wherein the heating the powder mixture further comprises heating the powder mixture to a temperature where aluminum melts while graphene remains in solid form and cooling includes the formation of planar hexagonal graphene ring structures seeding the formation of crystals of aluminum to form the graphene doped aluminum composite.

2. The method of claim 1 wherein either of the homogenously dispersing the graphene powder or the homogenously dispersing the aluminum powder comprises at least one of: stirring continuously, stirring in intervals, or operating an ultrasonic device.

3. The method of claim 1 wherein the evaporating the homogeneous dispersion occurs at 20 degrees Celsius.

4. The method of claim 1 wherein the evaporating the homogeneous dispersion further comprises operating one of a vacuum chamber or an auxiliary heating device to remove liquid from the homogenous dispersion.

5. The method of claim 1 wherein the heating the powder mixture comprises heating the powder mixture to at least 660 degrees Celsius.

6. The method of claim 1, further comprising preventing oxidation of the powder mixture by utilizing an atmosphere of at least one of argon or nitrogen.

7. The method of claim 1 wherein the graphene doped aluminum composite has an electrical conductivity that is at least 0.7 µS/m and a thermal conductivity that is at least 400 W/m·K.

8. The method of claim 1 wherein the formation of crystals of aluminum includes forming two cubic close-packed crystals of aluminum on each of the graphene ring structures.

9. The method of claim 1, further comprising at least one of pressing or extruding the graphene doped aluminum composite.

* * * * *